(12) United States Patent
Ooi et al.

(10) Patent No.: US 6,767,616 B2
(45) Date of Patent: Jul. 27, 2004

(54) METAL CORE SUBSTRATE AND PROCESS FOR MANUFACTURING SAME

(75) Inventors: Kazuhiko Ooi, Nagano (JP); Masaru Yamazaki, Nagano (JP); Yukiji Watanabe, Nagano (JP); Takaaki Yazawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/436,143

(22) Filed: May 13, 2003

(65) Prior Publication Data

US 2003/0215619 A1 Nov. 20, 2003

(30) Foreign Application Priority Data

May 14, 2002 (JP) ........................................ 2002-138634

(51) Int. Cl.⁷ .............................. B32B 3/00; H01R 9/09
(52) U.S. Cl. ........................ 428/209; 428/901; 174/261; 174/264
(58) Field of Search ................................ 428/209, 901; 174/261, 264, 265, 266

(56) References Cited

U.S. PATENT DOCUMENTS

| | | | |
|---|---|---|---|
| 4,642,160 A | * 2/1987 | Burgess | |
| 5,876,842 A | * 3/1999 | Duffy et al. | 428/209 |
| 5,879,787 A | * 3/1999 | Petefish | 428/209 |
| 6,098,282 A | 8/2000 | Frankeny et al. | |
| 6,229,095 B1 | * 5/2001 | Kobayashi | 174/255 |
| 6,335,076 B1 | * 1/2002 | Nakamura et al. | 428/131 |
| 6,373,000 B2 | * 4/2002 | Nakamura et al. | 174/264 |
| 6,388,204 B1 | * 5/2002 | Lauffer et al. | 174/261 |
| 6,395,378 B2 | * 5/2002 | Bergstedt et al. | 428/209 |
| 6,420,018 B1 | * 7/2002 | Inoue et al. | 428/209 |
| 6,497,943 B1 | * 12/2002 | Jimarez et al. | 428/209 |
| 6,521,843 B1 | * 2/2003 | Kohya | 174/255 |
| 6,617,526 B2 | * 9/2003 | Miller | 174/261 |

FOREIGN PATENT DOCUMENTS

| JP | 53-111472 | 9/1978 |
|---|---|---|
| JP | 2000-244130 | 9/2000 |

* cited by examiner

*Primary Examiner*—Cathy F. Lam
(74) *Attorney, Agent, or Firm*—Staas & Halsey LLP (57) ABSTRACT

A metal core substrate comprises a core layer (10) consisting of first and second metal plates (11, 12) layered with a third insulating layer (13) interposed therebetween; first and second insulating layers (20, 21) formed on the first and metal plates, respectively; first and second wiring patterns (45, 46) formed on the first and second insulating layers, respectively. A conductive layer (40) formed in a through-hole (22) penetrates the first insulating layer, the first metal plate, the third insulating layer, the second metal plate and the second insulating layer for electrically connecting the first wiring pattern with the second wiring pattern. The first metal plate (11) is electrically connected with the first wiring pattern (45) and the second wiring pattern (46), respectively, by means of a via (44) and by means a via (43). The second metal plate (12) is electrically connected with the second wiring pattern (46) and the first wiring pattern (45), respectively, by means of a via (42) and by means a via (41), respectively.

15 Claims, 6 Drawing Sheets

METAL CORE SUBSTRATE AND PROCESS FOR MANUFACTURING SAME

BACKGROUND OF THE INVENTION

1. Field of the Invention

The present invention relates to a metal core substrate and a manufacturing process thereof.

2. Description of the Related Art

A metal core substrate is known and is used as a package on which a semiconductor chip is mounted.

Concerning the metal core substrate, there have been provided various types of structure. According to the official gazette of Japanese Unexamined Patent Publication (Kokai) No. 2000-244130, there is disclosed a metal core substrate which has a coaxial structure, of a so-called "Via in Via" type, which reduces inductance and also has a capacitor structure inside.

Figure 18:
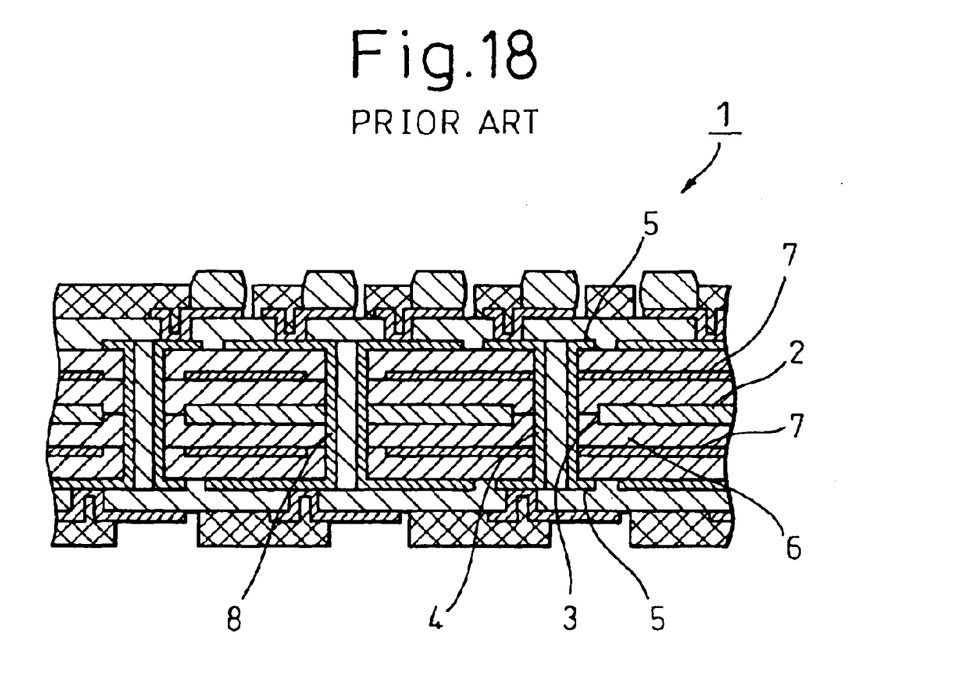
FIG. 18 is a schematic illustration showing a section of an example of the conventional metal core substrate known in the prior art.

As shown in FIG. 18, this metal core substrate 1 is composed as follows. On the metal plate 2, through-holes 3 are formed, and the upper and lower wiring patterns 5 are electrically connected with each other by the through-hole plating films 4 in a structure called "Via in Via". On both sides of the metal plate 2, the copper foil layers 7, 7 are provided via the dielectric layers 6. These copper foil layers 7, 7 are electrically connected to the through-hole plating films 4. On the other hand, the other through-hole plating film 8 and the metal plate 2 are electrically connected with each other, so that capacitor structures are formed between the metal plate 2 and the copper foil layers 7, 7, respectively.

The above metal core substrate 1 provides an effect that the inductance can be reduced. Further, the above metal core substrate 1 provides an effect of effectively removing noise because the capacitor structure is formed at a position right below the semiconductor chip which is to be mounted.

However, as shown in FIG. 18, both the through-hole for signal use and the through-hole used for connection of the metal plate 2 exist on the above metal core substrate 1. Therefore, the density of the wiring pattern for signal use must be restricted, that is, it does not allow an increase in the density.

SUMMARY OF THE INVENTION

The present invention has been accomplished to solve the above problems.

It is an object of the present invention to provide a metal core substrate, and a manufacturing method thereof, characterized in that the electric performance can be enhanced and high density wiring can be provided.

According to the present invention, there is provided a metal core substrate comprising: a core layer comprising first and second metal plates layered by means of a third insulating layer interposed therebetween; first and second insulating layers formed on the first and second metal plates, respectively; first and second wiring patterns formed on the first and second insulating layers, respectively; a conductive means formed in a through-hole penetrating the first insulating layer, the first metal plate, the third insulating layer, the second metal plate and the second insulating layer to be exposed to insulating portions with respect to the first and second metal plates, respectively, for electrically connecting the first wiring pattern with the second wiring pattern; first connecting means for electrically connecting the first metal plate with the first wiring pattern and the second wiring pattern, respectively, by means of a via penetrating the first insulating layer and by means a via formed in a via-hole penetrating the second insulating layer, the second metal plate and the third insulating layer so as to be exposed to an insulating portion with respect to the second metal plate; and second connecting means for electrically connecting the second metal plate with the second wiring pattern and the first wiring pattern, respectively, by means of a via penetrating the second insulating layer and by means a via formed in a via-hole penetrating the first insulating layer, the first metal plate and the third insulating layer so as to be exposed to an insulating portion with respect to the first metal plate.

The first metal plate is a ground plane and the second metal plate is a power plane.

The first and second wiring patterns are multi-layered patterns formed in and on the first and second insulating layers, respectively.

The third insulating layer may preferably be a dielectric layer.

According to another aspect of the present invention, there is provided a metal core substrate comprising a core layer comprising first and second metal plates layered with a third insulating layer interposed therebetween, the first and second metal plates having first through-holes at positions overlapping to each other in a core thickness direction, the first and second metal plates also having third and fourth through-holes, respectively, at positions not overlapping to each other in the core thickness direction; first and second insulating layers formed on the first and second metal plates, respectively, so that the first, third and fourth through-holes are embedded therewith; the first, second and third insulating layers having a second through-hole penetrating therethrough and penetrating the first through-holes so as not to be exposed to the first and second metal plates, respectively; the first and third insulating layers having a first via-hole penetrating therethrough and penetrating the third through-hole to be exposed to the second metal plate, but not to be exposed to the first metal plate; the second insulating layer having a second via-hole penetrating therethrough to be exposed to the second metal plate; the second and third insulating layers having a third via-hole penetrating therethrough and penetrating the fourth through-hole to be exposed to the first metal plate, but not to be exposed to the second metal plate; the first insulating layer having a fourth via-hole penetrating therethrough to be exposed to the first metal plate; first and second wiring patterns formed on the first and second insulating layers, respectively; a conductive means formed in the second through-hole for electrically connecting the first wiring pattern with the second wiring pattern; a first via formed in the first via-hole for electrically connecting the second metal plate with the first wiring pattern; a second via formed in the second via-hole for electrically connecting the second metal plate with the second wiring pattern; a third via formed in the third via-hole for electrically connecting the first metal plate with the second wiring pattern; and a fourth via formed in the fourth via-hole for electrically connecting the first metal plate with the first wiring pattern.

The second through-hole has a diameter smaller than that of the first through-holes, the first via-hole has a diameter smaller than that of the third through-hole, and the third via-hole has a diameter smaller than that of the fourth through-hole.

The first through-hole of the first metal layer and the third through-hole of the first metal layer are coaxially formed as a single through-hole which has a diameter (A) larger than that (B) of the first through-hole of the second metal layer;

the second through-hole and the first via-hole are coaxially formed in such a manner that a diameter (C) of the first via-hole is smaller than that (A) of the third through-hole and larger than that (B) of first through-hole, and a diameter (D) of the second through-hole is smaller than that (B) of the first through-hole; and the first via and conductive means are coaxial in such a manner that an insulating portion is interposed therebetween.

According to still another aspect of the present invention, there is provided a process for manufacturing a metal core substrate comprising the following steps of: preparing a core layer comprising first and second metal plates layered with a third insulating layer interposed therebetween; forming the first and second metal plates with first through-holes, respectively, at positions overlapping to each other in a core thickness direction and with third and fourth through-holes, respectively, at positions not overlapping each other in the core thickness direction; laminating first and second insulating layers on the first and metal plates, respectively, so that the first, third and fourth through-holes are embedded therewith; forming the first, second and third insulating layers with a second through-hole penetrating therethrough and penetrating the first through-holes so as not to be exposed to the first and second metal plates, respectively; the first and third insulating layers with a first via-hole penetrating therethrough and penetrating the third through-hole to be exposed to the second metal plate, but not to be exposed to the first metal plate; the second insulating layer with a second via-hole penetrating therethrough to be exposed to the second metal plate; the second and third insulating layers with a third via-hole penetrating therethrough and penetrating the fourth through-hole to be exposed to the first metal plate, but not to be exposed to the first metal plate; and the first insulating layer with a fourth via-hole penetrating therethrough to be exposed to the first metal plate; forming a conductive means in the second through-hole, a first via in the first via-hole, a second via in the second via-hole, a third via formed in the third via-hole, and a fourth via formed in the fourth via-hole; forming first and second wiring patterns formed on the first and second insulating layers, respectively, so as to be electrically connected to the conductive means, the first via, the second via, the third via, and the fourth via.

BRIEF DESCRIPTION OF THE DRAWINGS

FIGS. 1 to 9 are manufacturing process drawings in which:

DETAILED DESCRIPTION OF THE PREFERRED EMBODIMENTS

Referring to the accompanying drawings, a preferred embodiment of the present invention will be explained in detail below.

Referring to FIGS. 1 to 9, both the manufacturing process and the metal core substrate are explained as follows.

Figure 1:
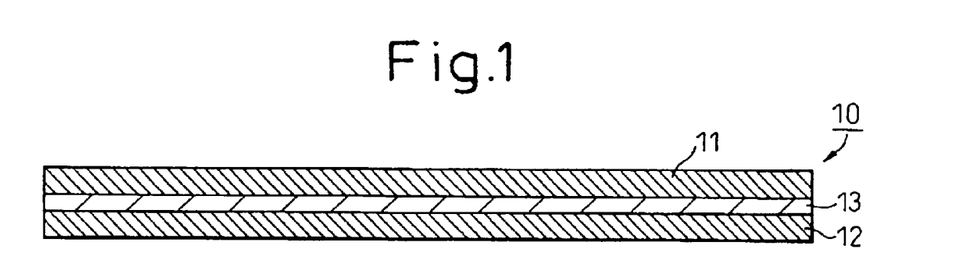
FIG. 1 is a schematic illustration for explaining a section of a core layer.

FIG. 1 is a view showing a core layer 10 on which two metal plates of the first metal plate 11 and the second metal plate 12 are laminated while an insulating layer 13, such as a dielectric layer 13 is interposed between them. From the viewpoint of ensuring the mechanical strength, it is preferable that the first metal plate 11 and the second metal plate 12 are respectively composed of a copper plate of 0.2 to 0.3 mm thickness. In this connection, it should be noted that the material of the metal plates is not limited to the copper plate.

It is preferable that the dielectric layer 13 is a ferroelectric layer of 40 to 50 μm thickness in which a powder of a ferroelectric material, such as strontium titanate (STO) or barium titanate, is mixed into resin such as epoxy, polyimide or polyphenylene ether.

The core layer 10 is formed in such a manner that two metal plates are laminated while a resin sheet in a tack dry state (stage B), in which ferroelectric powder is mixed, is interposed between them. Alternatively, the core layer 10 is formed in such a manner that after one metal plate is coated with resin in which ferroelectric powder is mixed, the other metal plate is laminated, so that the two metal plates are made to adhere to each other.

The dielectric layer 13 may be formed by means of sputtering or by a method of CVD of ferroelectric, materials such as strontium titanate or barium titanate. After the dielectric layer has been formed on one metal plate by means of sputtering or by the method of CVD, the other metal plate is laminated by resin (resin sheet or coating of resin) which becomes an adhesive layer. In this way, the two metal plates are made to adhere to each other so as to form the core layer 10.

In this case, the metal plates 11, 12 may be made of aluminum or 42 alloy (iron-nickel alloy).

Alternatively, the core layer (substrate) may be formed in such a manner that the metal plates 11, 12, in which the through-holes 15, 16, 17 have already been formed by means of etching or punching, are laminated on each other while the insulating layer (or the dielectric layer) 13 is being interposed between them.

In this connection, the above dielectric layer 13 may be a simple insulating layer (third insulating layer).

This insulating layer may be made of a resin such as epoxy, polyimide or polyphenylene ether. In this case, the core layer 10 is formed in such a manner that two metal plates are laminated on each other while a resin sheet in a tack dry state (B stage) is interposed between them. Alternatively, the core layer 10 is formed in such a manner that after one metal plate is coated with resin, the other metal plate is laminated on it so as to make the two metal plates adhere to each other.

Figure 2:
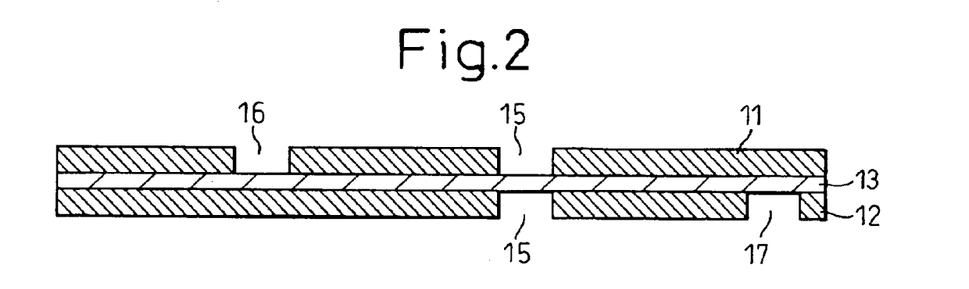
FIG. 2 is a schematic illustration for explaining a section in a state in which through-holes are formed on a metal plate.

Next, as shown in FIG. 2, the first metal plate 11 and the second metal plate 12 are etched by a method of photolithography so as to form through-holes.

Reference numeral 15 is the first through-hole. The first through-hole is formed on the first metal plate 11 and the second metal plate 12, wherein the first through-hole is formed at a position on the first metal plate 11 and the first through-hole is also formed at a position on the second metal plate, and these two positions overlap each other with respect to the thickness direction of the core layer 10. At another position on the first metal plate 11, which does not overlap a position on the second metal plate 12 with respect to the thickness direction of the core layer 10, the third through-hole 16 is formed, and at another position on the second metal plate 12, which does not overlap the position on the first metal plate 11 with respect to the thickness direction of the core layer 10, the fourth through-hole 17 is formed.

Figure 3:
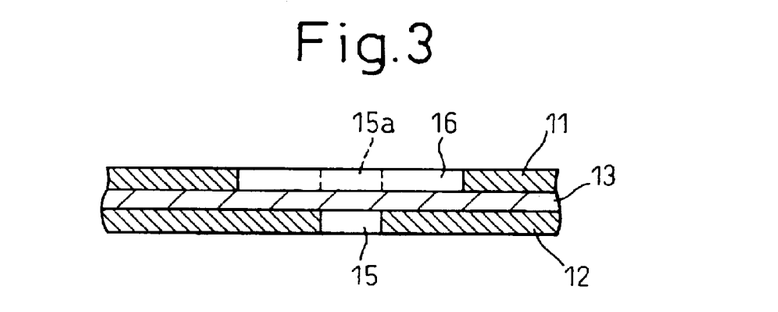
FIG. 3 is a schematic illustration showing another embodiment of a through-hole.

In this connection, the following composition may be adopted. As shown in FIG. 3, the first through-hole 15 is formed on the second metal plate 12. On the first metal plate 11, a through-hole, the diameter of which is larger than that of the first through-hole 15 formed on the second metal plate 12, is formed at a position overlapping the first through-hole 15 with respect to the thickness direction. A portion of the through-hole formed on the first metal plate 11, which agrees with the through-hole 15 formed on the second metal plate 12, is made to be the first through-hole 15a, and a portion of the through-hole formed on the first metal plate 11, which does not agree with the through-hole 15 formed on the second metal plate 12, is made to be the third through-hole 16. In other words, the through-hole, the diameter of which is large, may be used as both the first through-hole 15 and the third through-hole 16, as described later in detail.

Figure 4:
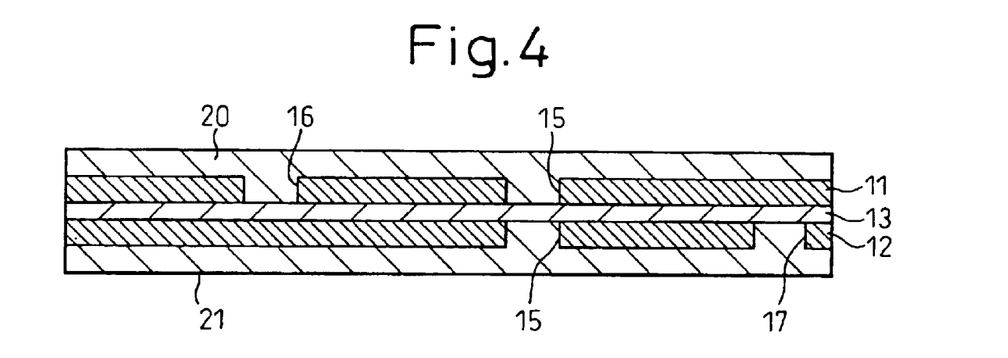
FIG. 4 is a schematic illustration showing a section in a state in which insulating layers are laminated.

Next, as shown in FIG. 4, first insulating layer 20 and second insulating layer 21 are respectively subjected to thermo-compression bonding to the outer faces of the first metal plate 11 and the second metal plate 12 so that the first through-holes 15, the third through-hole 16 and the fourth through-hole 17 can be embedded in the insulating layers 20, 21. The first insulating layer 20 and the second insulating layer 21 can be made of resin such as epoxy, polyimide or polyphenylene ether. The first insulating layer 20 and the second insulating layer 21 can be formed when a resin sheet in a tack dry state (stage B) is laminated or resin is coated.

Figure 5:
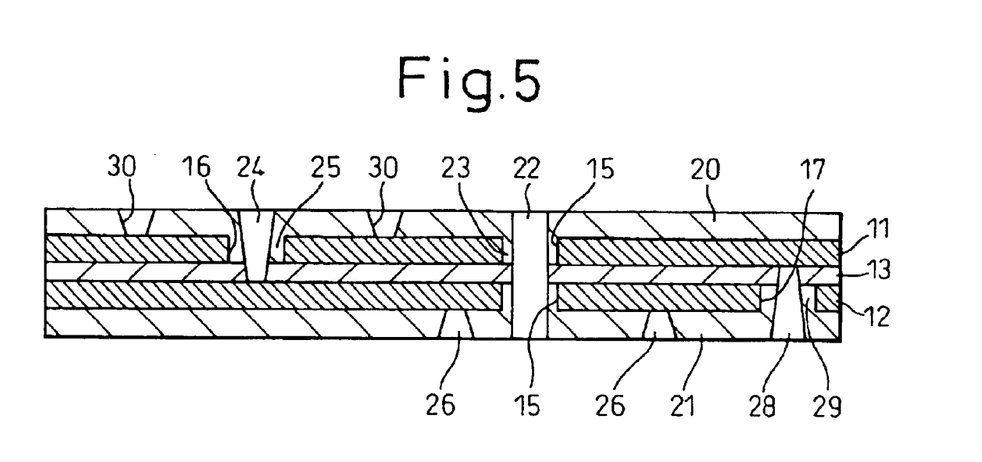
FIG. 5 is a schematic illustration showing a section in a state in which through-holes and via-holes are formed.

Next, as shown in FIG. 5, a second through-hole 22, the diameter of which is smaller than that of the first through-hole 15, is formed in the first through-hole 15 so that the second through-hole 22 can penetrate the first insulating layer 20, the dielectric layer 13 and the second insulating layer 21. Accordingly, the insulating portions 23 remain on the inner wall of the first through-hole 15.

The first through-hole 22 may be formed by means of drilling. However, it is preferable that the first through-hole 22 is formed by means of irradiated laser beams such as carbonic acid gas ($CO_2$) laser beams. When the laser beams are used, it is possible to make a small through-holes, the diameters of which are 100 to 120 $\mu$m. Therefore, the density of wiring can be increased because of the small holes. In this connection, it is necessary to maintain the thickness of the insulating portion 23 at 40 to 50 $\mu$m. Accordingly, the diameter of the first through-hole 15 is determined to be about 200 $\mu$m.

In the third through-hole 16, a first via-hole 24 is formed, the diameter of which is smaller than that of the third through-hole 16, so that the first via-hole 24 can penetrate the first insulating layer 20 and the dielectric layer 13 and further the second metal plate 12 can be exposed to the bottom face of the first via-hole 24. Accordingly, the insulating portion 25 remains on the inner wall of the third through-hole 16. It is preferable that the first via-hole 24 is formed by means of irradiated laser beams.

A second via-hole 26 is formed in such a manner that it penetrates the second insulating layer 21 and the second metal plate 12 is exposed to the bottom face of the second via-hole 26. It is preferable that this second via-hole 26 is also formed by means of irradiated laser beams.

In the fourth through-hole 17, a third via-hole 28 is formed, the diameter of which is smaller than that of the fourth through-hole 17, so that the third via-hole 28 can penetrate the second insulating layer 21 and the dielectric layer 13 and, further, the first metal plate 11 can be exposed to the bottom face of the third via-hole 28. Accordingly, the insulating portion 29 remains on the inner wall of the fourth through-hole 17. It is preferable that the third via-hole 28 is also formed by means of irradiated laser beams.

A fourth via-hole 30 is formed in such a manner that it penetrates the first insulating layer 20 and the first metal plate 11 is exposed to the bottom face of the fourth via-hole 30. It is preferable that this fourth via-hole 30 is also formed by means of irradiated laser beams.

The second through-hole 22, the first via-hole 24, the second via-hole 26, the third via-hole 28 and the fourth via-hole 30 are different from each other in the depth of these holes and the positions at which these holes are located. However, it is preferable to simultaneously conduct the process of forming these holes which are to be formed on the common side of the substrate.

Figure 6:
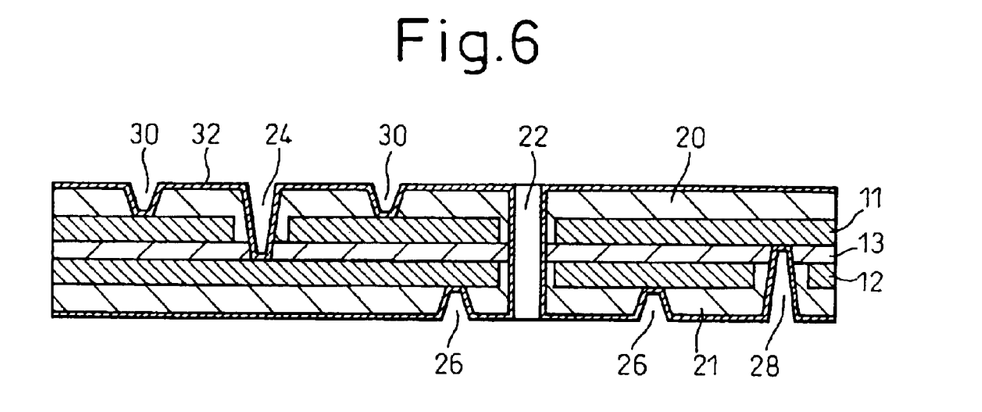
FIG. 6 is a schematic illustration showing a section in a state in which electroless plating films are formed.

Next, as shown in FIG. 6, an electroless plating film 32 of copper is formed on the inner walls of the second through-hole 22, the first via-hole 24, the second via-hole 26, the third via-hole 28 and the fourth via-hole 30.

Figure 7:
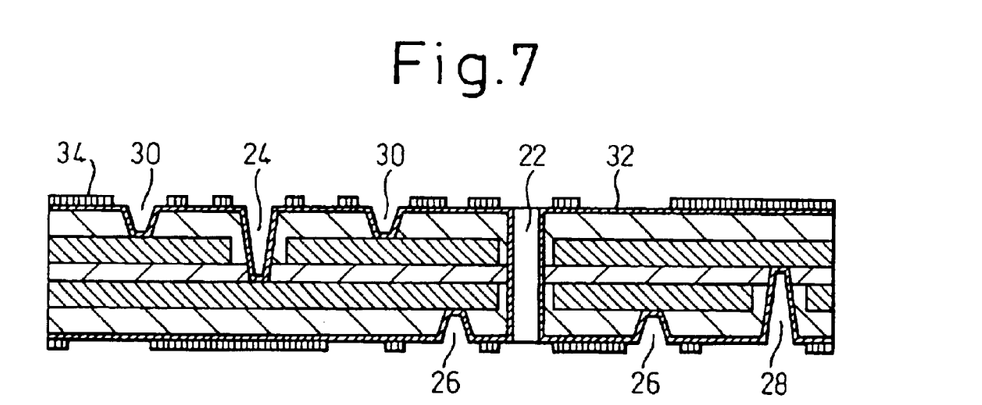
FIG. 7 is a schematic illustration showing a section in a state in which resist patterns are formed.

Next, as shown in FIG. 7, a dry film resist layer is bonded on the electroless plating films 32 and exposed to light and developed. In this way, the resist patterns 34 are formed so that the electroless plating films 32 can be exposed after the pattern of wiring patterns to be formed.

Figure 8:
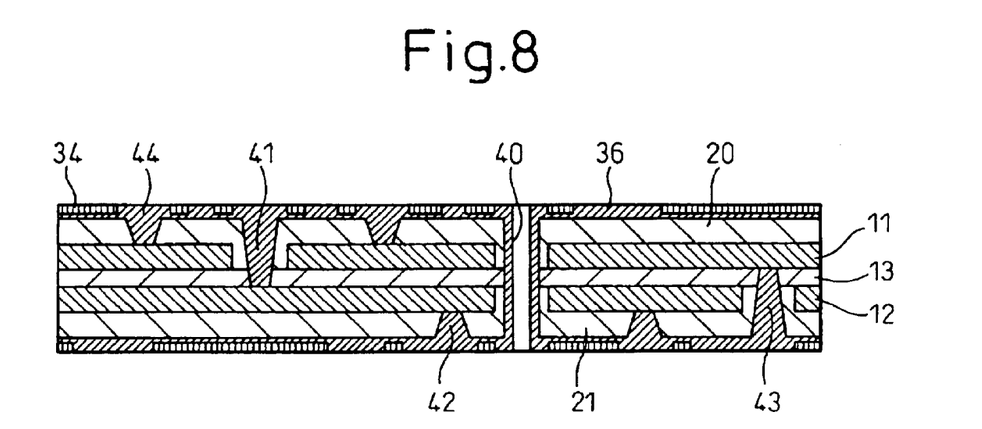
FIG. 8 is a schematic illustration showing a section in a state in which electrolytic plating is conducted while a resist pattern is being used as a mask.

Next, as shown in FIG. 8, while the resist pattern 34 is being used as a mask, electrolytic plating films 36 are formed on the electroless plating films 32 by means of electrolytic copper plating so that wiring patterns can be formed.

At the same time, through-hole plating film (conductive layer) 40, first via 41, second via 42, third via 43 and fourth via 44 are respectively formed in the second through-hole 22, the first via-hole 24, the second via-hole 26, the third via-hole 28 and the fourth via-hole 30.

Figure 9:
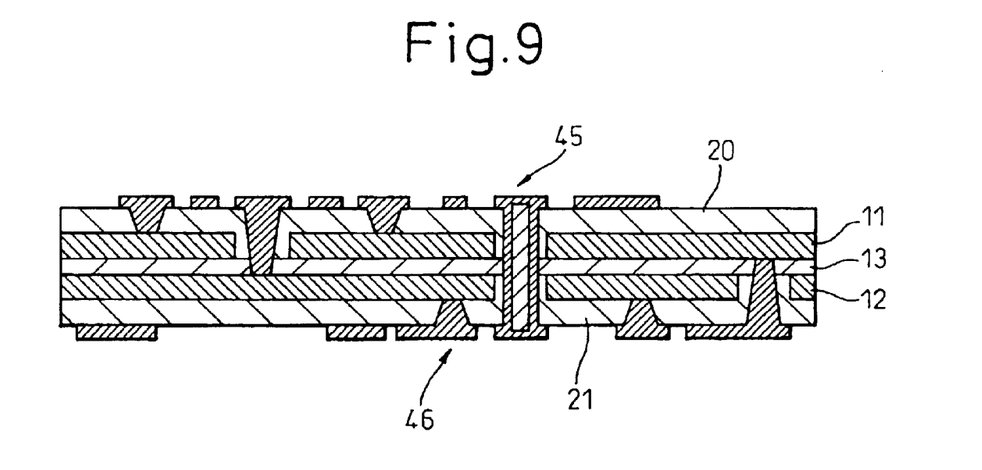
FIG. 9 is a schematic illustration showing a section in a state in which wiring patterns are formed.
Figure 10:
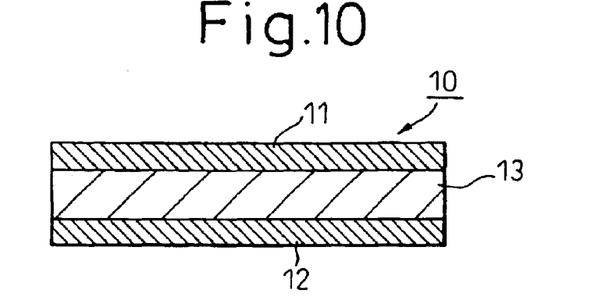
FIGS. 10 to 17 illustrate another embodiment of a process for manufacturing a metal core substrate in relation to the structure shown in FIG. 3.

Next, as shown in FIG. 9, when the resist patterns 34 are removed and the exposed electroless plating films 32 are removed by means of etching, the first wiring pattern 45 is formed on the first insulating layer 20, and the second wiring pattern 46 is formed on the second insulating layer 21.

Bumps such as solder balls (not shown) are formed in external connecting terminal portions of the second wiring pattern 46. Pads (not shown) used for mounting a semiconductor chip are formed at the terminal portions of the first wiring pattern 45. In this way, a package used for mounting the semiconductor chip can thus be obtained. In this connection, resin can be filled in the through-hole 22.

In the above embodiment, the wiring patterns 45, 46 are formed by a so-called "semi-additive method". However, it is possible to form predetermined wiring patterns in any other know methods, such as a so-called "additive method" or "subtractive method". For example, an electrolytic plating film (not shown) can be uniformly formed on the electroless plating films 32 and etched into predetermined wiring patterns.

The wiring patterns 45, 46 can be formed into a multiple layer by a "build-up method"(not shown).

As described above, it is possible to form a metal core substrate of the coaxial structure in which the through-hole plating film 40 is surrounded by both the metal plates 11, 12 via the insulating portion 23. Therefore, the inductance can be reduced and the electric performance can be enhanced. When the second through-hole 22 and others are machined by means of irradiated laser beams, it is possible to form minute holes. Therefore, it becomes possible to provide wiring of high density.

When the first metal plate 11 is connected to the ground so that it can be used as a common grounding plane and when the second metal plate 12 is connected to an electric power source so that it can be used as a common electric power source plane, the number of the connecting sections (the second via 42 and the third via 43) with the mount substrate can be reduced. Therefore, the density of the internal wiring can be enhanced.

Further, it is possible to form a capacitor of a large capacity between the first metal plate 11 and the second metal plate 12. Since the capacitor is formed right below a semiconductor chip to be mounted (not shown), the occurrence of noise can be effectively reduced. Electric connection to the first metal plate 11 and the second metal plate 12, which are electrodes of the capacitor, is accomplished by the first via 41 and the third via 43, the diameters of which are small, penetrating only one metal plate and also accomplished by the second via 42 and the fourth via 44. Therefore, it is unnecessary to accomplish electric connection via the through-hole plating film penetrating the entire substrate like the conventional example such as shown in FIG. 18. Accordingly, the coaxial structure line, which is composed of the through-hole plating film 40 connecting the first wiring pattern 45 with the second wiring pattern 46, can be arranged at a higher density. Therefore, the density of wiring can be highly enhanced.

FIGS. 10 to 17 illustrate another embodiment in relation to the structure shown in FIG. 3. First, in FIG. 10, a core layer 10 is prepared by first and second metal plates 11, 12 layered by means of a third insulating layer 13 interposed therebetween, in the same manner as the step shown in FIG. 1.

Figure 11:
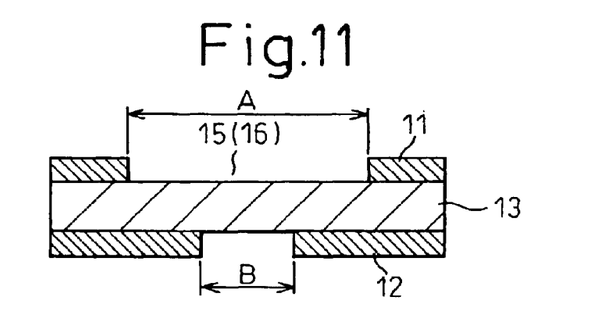

Next, in FIG. 11, a third through-hole 16 (including first through-hole 15a) and a first through-hole 15 are formed in the first and second metal plates 11, 12, respectively, at positions overlapping and co-axial to each other in a core thickness direction. However, the diameter (A) of third through-hole 16 formed in the first metal plate 11 is larger than that (B) of the through-hole 15 formed in the second metal plate 12.

Figure 12:
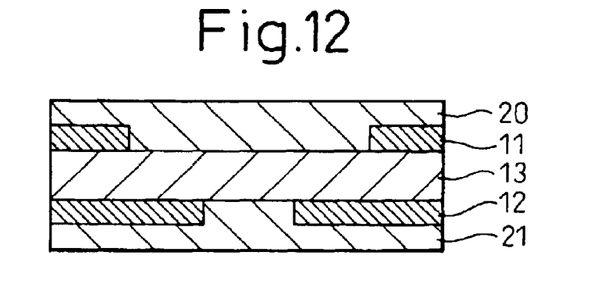

Next, in FIG. 12, first insulating layer 20 is laminated on the first metal plate 11 and second insulating layer 21 is laminated on the second metal plate 12, in such a manner that the insulating layers 20 and 21 are embedded in the through-holes 16 and 15, respectively, in a manner similar to the step shown in FIG. 4.

Figure 13:
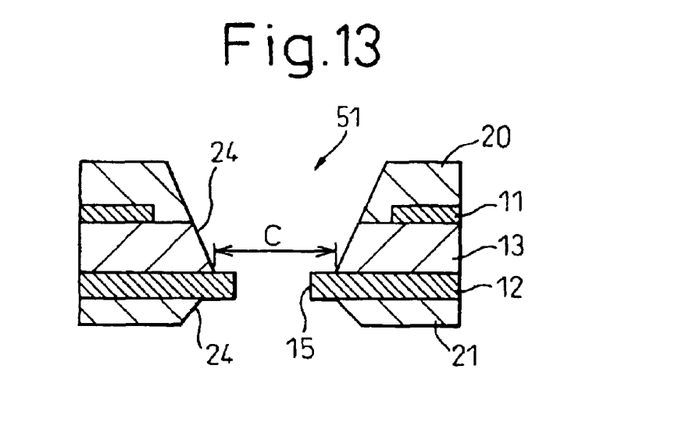

Next, in FIG. 13, a first via-hole 24 is formed by drilling with a laser beam in such a manner that the first via-hole 24 penetrates the first insulating layer 20, the third insulating layer 13, and second insulating layer 21, as well as the through-holes 16 and 15. In this connection, however, the diameter (C) of this first via-hole 24 is smaller than that (A) of the through-hole 16, but larger than that (B) of the through-hole 15, so that there is an insulating portion on the inner wall of the via-hole 24 with respect to the first metal plate 11 and, on the other hand, the second metal plate 12 is exposed at its peripheral portion of its through-hole 15.

Figure 14:
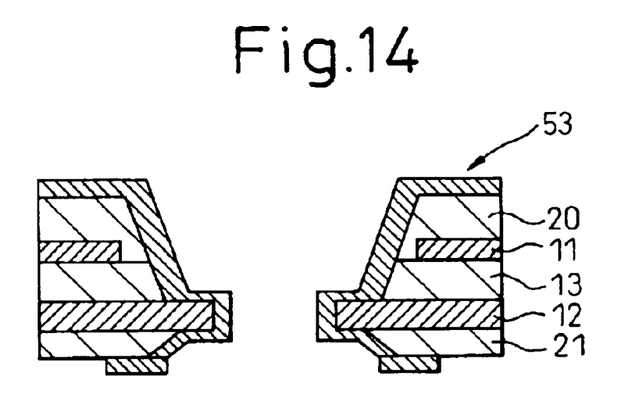

Next, in FIG. 14, an electroless plating film 53 of copper is formed on the inner wall of the first via-hole 24. Also, an electrolytic plating film (53) is formed on the electroless plating film to obtain a metal layer, which is then etched to form wiring patterns, in the similar manner as the steps shown in FIGS. 6–8.

Figure 15:
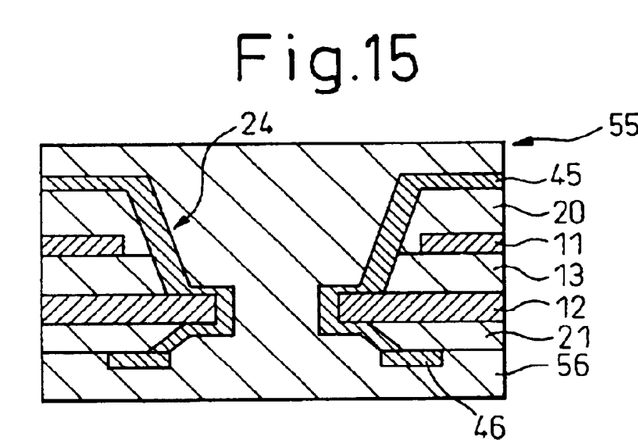

Next, in FIG. 15, insulating layers 55, 56 are laminated on the wiring patterns 45, 46 thus formed on the first and second insulating layers 20 and 21, in such a manner that the insulating layers 55, 56 are embedded in the via-hole 24.

Figure 16:
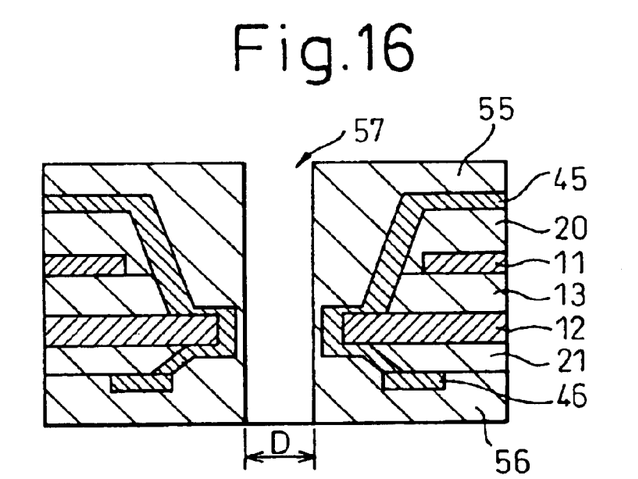

Next, in FIG. 16, a further through-hole 57 is formed by drilling with a laser beam in such a manner that the through-hole penetrates the insulating layers 55, 56. In this connection, however, the diameter (D) of this through-hole 57 is smaller than that (B) of the through-hole 15 of the second metal plate 12, so that there is an insulating portion on the inner wall of the through-hole 57 with respect to the plated metal layer.

Figure 17:
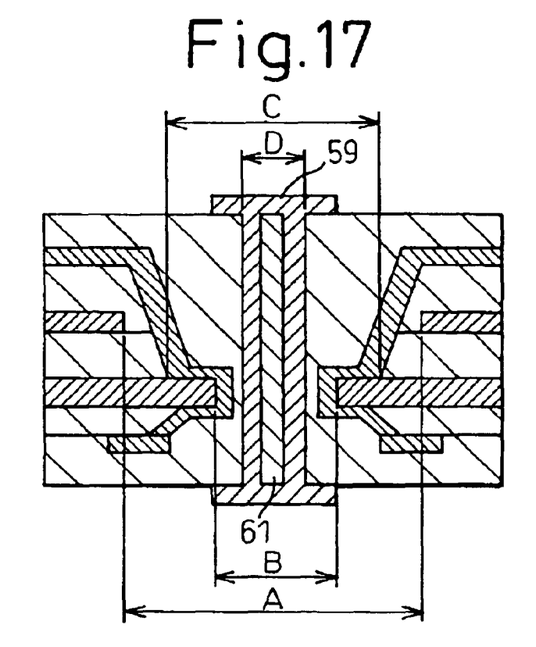

Next, in FIG. 17, a through-hole plating film (conductive layer) 59 is formed in the through-hole 57 by electroless plating and electrolytic plating of copper. Then, the through-hole 57 is filled with a resin 61. The, metal layers are formed on the respective insulating layers by electroless plating and electrolytic plating of copper. In this connection, the through-hole 57, which has been filled with the resin 61, is also covered by the metal layers thus formed. Then, the metal layers are etched to form wiring patterns.

It should be understood by those skilled in the art that the foregoing description relates to only a preferred embodiment of the disclosed invention, and that various changes and modifications may be made to the invention without departing from the sprit and scope thereof.

What is claimed is:
1. A metal core substrate comprising:
 a core layer (10) comprising first and second metal plates (11, 12) layered by a third insulating layer (13) interposed therebetween;
 first and second insulating layers (20, 21) formed on said first and second metal plates, respectively;
 first and second wiring patterns (45, 46) formed on said first and second insulating layers, respectively;
 a first conductor (40) formed in a through-hole (22) penetrating said first insulating layer (20), said first metal plate (11), said third insulating layer (13), said second metal plate (12) and said second insulating layer (21) onto to insulating portions (23) with respect to said first and second metal plates, respectively, to electrically connect said first wiring pattern with said second wiring pattern;
 second conductor to electrically connect said first metal plate (11) with said first wiring pattern (45) and said second wiring pattern (46), respectively, by a via (44) penetrating said first insulating layer (20) and by a via (43) formed in a via-hole (28) penetrating said second insulating layer (21), said second metal plate (12) and said third insulating layer (13) onto to an insulating portion (29) with respect to said second metal plate (12); and a third conductor to electrically connect said second metal plate (12) with said second wiring pattern (46) and said first wiring pattern (45), respectively, by a via (42) penetrating said second insulating layer (21) and by a via (41) formed in a via-hole (24) penetrating said first insulating layer (20), said first metal plate (11) and said third insulating layer (13) onto to an insulating portion (25) with respect to said first metal plate (11).

2. A metal core substrate as set forth in claim 1, wherein said first metal plate (11) is a ground plane and said second metal plate (12) is a power plane.

3. A metal core substrate as set forth in claim 1, wherein said first and second wiring patterns (45, 46) are multi-layered patterns formed in and on said first and second insulating layers (20, 21), respectively.

4. A metal core substrate as set forth in claim 1, wherein said third insulating layer (13) is a dielectric layer.

5. A metal core substrate comprising:

a core layer (10) comprising first and second metal plates (11, 12) layered by a third insulating layer (13) interposed therebetween, said first and second metal plates having first through-holes (15) at positions overlapping each other in a core thickness direction, said first and second metal plates also having third and fourth through-holes (16, 17), respectively, at positions not overlapping each other in the core thickness direction;

first and second insulating layers (20, 21) formed on said first and second metal plates, respectively, so that said first, third and fourth through-holes (15, 16, 17) are embedded therewith;

said first, second and third insulating layers having a second through-hole (22) penetrating therethrough and penetrating said first through-holes so as not to be exposed to said first and second metal plates (11, 12), respectively;

said first and third insulating layers having a first via-hole (24) penetrating therethrough and penetrating said third through-hole (16) to be exposed to said second metal plate (12), but not to be exposed to said first metal plate (11);

said second insulating layer having a second via-hole (26) penetrating therethrough to be exposed to said second metal plate (12);

said second and third insulating layers having a third via-hole (28) penetrating therethrough and penetrating said fourth through-hole (17) to be exposed to said first metal plate (11), but not to be exposed to said second metal plate (12);

said first insulating layer having a fourth via-hole (30) penetrating therethrough to be exposed to said first metal plate (11);

first and second wiring patterns (45, 46) formed on said first and second insulating layers, respectively;

a conductor (40) formed in said second through-hole (22) to electrically connect said first wiring pattern with said second wiring pattern;

a first via (41) formed in said first via-hole (24) to electrically connect said second metal plate (12) with said first wiring pattern (45);

a second via (42) formed in said second via-hole (26) to electrically connect said second metal plate (12) with said second wiring pattern (46);

a third via (43) formed in said third via-hole (28) to electrically connect said first metal plate (11) with said second wiring pattern (46); and a fourth via (44) formed in said fourth via-hole (30) to electrically connect said first metal plate (11) with said first wiring pattern (45).

6. A metal core substrate as set forth in claim 5, wherein said second through-hole (22) has a diameter smaller than that of said first through-holes (15), said first via-hole (24) has a diameter smaller than that of said third through-hole (16), and said third via-hole (28) has a diameter smaller than that of said fourth through-hole (17).

7. A metal core substrate as set forth in claim 5, wherein said first metal plate (11) is a ground plane and said second metal plate (12) is a power plane.

8. A metal core substrate as set forth in claim 5, wherein said first and second wiring patterns (45, 46) are multi-layered patterns formed in and on said first and second insulating layers (20, 21), respectively.

9. A metal core substrate as set forth in claim 5, wherein said third insulating layer (13) is a dielectric layer.

10. A metal core substrate comprising:

a core layer (10) comprising first and second metal plates (11, 12) layered by a third insulating layer (13) interposed therebetween, the first and second metal plates having first through-holes (15a, 15) at positions overlapping each other in a core thickness direction;

said first through-holes (15a) of the first metal plate (11) being co-axial with, but having a diameter (A) larger than that (B) of said first through-hole (15) of the second metal plate (12);

first and second insulating layers (20, 21) formed on the first and second metal plates, respectively, so that the first through-holes (15a, 15) are embedded therewith;

said first, second and third insulating layers having a first via hole (24) penetrating therethrough and penetrating said first through-hole (15a) of the first metal plate so as not to be exposed to the first metal plate (11), but to be exposed to the second metal plate (12);

first and second wiring patterns (45, 46) formed on the first an second insulating layers, respectively, and a conductive unit formed on the first via-hole (24) to electrically connect the first wiring pattern with the second wiring pattern, said conductive unit being electrically connected to the second metal plate (12).

11. A metal core substrate as set forth in claim 10, wherein the first metal plate (11) is a ground plane and the second metal plate (12) is a power plane.

12. A metal core substrate as set forth in claim 10, wherein the first and second wiring patterns (45, 46) are multilayered patterns formed in and on the first and second insulating layers, respectively.

13. A metal core substrate as set forth in claim 10, wherein the third insulating layer is a dielectric layer.

14. A metal core substrate comprising:

a core layer comprising first and second metal plates layered by a third insulating layer interposed therebetween;

first and second insulating layers formed on said first and second metal plates, respectively;

first and second wiring patterns formed on said first and second insulating layers, respectively;

a first conductor formed in a through-hole penetrating said first insulating layer, said first metal plate, said third insulating layer, said second metal plate and said second insulating layer, the through-hole having insulating portions with respect to said first and second metal plates, respectively, to electrically connect said first wiring pattern with said second wiring pattern;

a second conductor to electrically connect said first metal plate with said first wiring pattern and said second wiring pattern, respectively, by a first via penetrating said first insulating layer and by a second via formed in a via-hole penetrating said second insulating layer, said second metal plate and said third insulating layer, wherein said second via has an insulating portion with respect to said second metal plate; and a third connector to electrically connect said second metal plate with said second wiring pattern and said first wiring pattern, respectively, by a third via penetrating said second insulating layer and by a fourth via formed in a via-hole penetrating said first insulating layer, said first metal plate and said third insulating layer, wherein said fourth via has an insulating portion with respect to said first metal plate.

15. A metal core substrate comprising:

a core layer comprising first and second metal plates layered by a third insulating layer interposed therebetween, said first and second metal plates having first through-holes at positions overlapping each other in a core thickness direction, said first and second metal plates also having non-overlapping third and fourth through-holes, respectively, in the core thickness direction;

first and second insulating layers formed on said first and second metal plates, respectively, so that said first, third and fourth through-holes are embedded therewith;

said first, second and third insulating layers having a second through-hole penetrating therethrough and penetrating said first through-holes, wherein the second through-hole is insulated from said first and second metal plates, respectively;

said first and third insulating layers having a first via-hole penetrating therethrough and penetrating said third through-hole to be exposed to said second metal plate, and is insulated from said first metal plate;

said second insulating layer having a second via-hole penetrating therethrough to be exposed to said second metal plate;

said second and third insulating layers having a third via-hole penetrating therethrough and penetrating said fourth through-hole to be exposed to said first metal plate, and insulated from said second metal plate;

said first insulating layer having a fourth via-hole penetrating therethrough to be exposed to said first metal plate;

first and second wiring patterns formed on said first and second insulating layers, respectively;

a conductor formed in said second through-hole to electrically connect said first wiring pattern with said second wiring pattern;

a first via formed in said first via-hole to electrically connect said second metal plate with said first wiring pattern;

a second via formed in said second via-hole to electrically connect said second metal plate with said second wiring pattern;

a third via formed in said third via-hole to electrically connect said first metal plate with said second wiring pattern; and a fourth via formed in said fourth via-hole to electrically connect said first metal plate with said first wiring pattern.

* * * * *

UNITED STATES PATENT AND TRADEMARK OFFICE
CERTIFICATE OF CORRECTION

PATENT NO. : 6,767,616 B2  
APPLICATION NO. : 10/436143  
DATED : July 27, 2004  
INVENTOR(S) : Kazuhiko Ooi et al.

It is certified that error appears in the above-identified patent and that said Letters Patent is hereby corrected as shown below:

In column 8, line 55, delete "to".

In column 8, line 65, delete "to".

In column 8, line 59, before "second" insert --a--.

Signed and Sealed this

Twelfth Day of February, 2008

JON W. DUDAS  
*Director of the United States Patent and Trademark Office*